United States Patent
Kim et al.

(10) Patent No.: US 8,524,118 B2
(45) Date of Patent: *Sep. 3, 2013

(54) NITRIDE PHOSPHOR, METHOD OF PREPARING THE SAME, AND WHITE LIGHT-EMITTING DEVICE USING THE SAME

(75) Inventors: Tae-gon Kim, Seoul (KR); Tae-hyung Kim, Seoul (KR); Seung-jae Im, Seoul (KR)

(73) Assignees: Samsung Electronics Co., Ltd. (KR); Samsung Electro-Mechanics Co., Ltd. (KR)

( * ) Notice: Subject to any disclaimer, the term of this patent is extended or adjusted under 35 U.S.C. 154(b) by 349 days.

This patent is subject to a terminal disclaimer.

(21) Appl. No.: 12/903,900

(22) Filed: Oct. 13, 2010

(65) Prior Publication Data

US 2011/0169398 A1    Jul. 14, 2011

(30) Foreign Application Priority Data

Jan. 12, 2010    (KR) .................... 10-2010-0002745

(51) Int. Cl.
  *C09K 11/08* (2006.01)
  *C09K 11/66* (2006.01)
(52) U.S. Cl.
  USPC .................................................. 252/301.4 F
(58) Field of Classification Search
  USPC ............... 252/301.4 R, 301.4 F; 313/467, 313/468
  See application file for complete search history.

(56) References Cited

U.S. PATENT DOCUMENTS

| | | |
|---|---|---|
| 6,770,748 B2 | 8/2004 | Imanishi et al. |
| 2008/0203901 A1* | 8/2008 | Bukesov et al. ............. 313/503 |
| 2009/0153582 A1* | 6/2009 | Hajjar et al. ................. 345/592 |
| 2010/0038590 A1* | 2/2010 | Suzuki et al. ........... 252/301.4 F |
| 2010/0237767 A1* | 9/2010 | Emoto et al. .................. 313/503 |

FOREIGN PATENT DOCUMENTS

WO    2005/083037 A1    9/2005

OTHER PUBLICATIONS

Liddell et al., 'M2(Si,Al)4(N,C)7 (M=La,Y,Ca) carbonitrides I. Synthesis and structureal characterisation by XRD and NMR', available online May 18, 2004, Journal of the European Ceramic Society, vol. 25, pp. 37-47.*
Li, Y.Q. et al., Preparation, structure and photoluminescence properties of Eu2+ and Ce3+-doped SrYSi4N7, J. of Solid State Chemistry, vol. 177:12, 2004, pp. 4687-4694.

(Continued)

*Primary Examiner* — Emily Le
*Assistant Examiner* — Lynne Edmondson
(74) *Attorney, Agent, or Firm* — Cantor Colburn LLP

(57) ABSTRACT

A nitride phosphor represented by Formula 1:

$$M^1_{a-z}Ce_zM^2_{b-x}M^3_xN_{c-y}O_y,\quad \text{Formula 1}$$

wherein $M^1$ is at least one metal selected from the group consisting of $Sc^{3+}$, $Y^{3+}$, $Lu^{3+}$, $La^{3+}$, $Pr^{3+}$, $Sm^{3+}$, $Gd^{3+}$, $Tb^{3+}$, $Yb^{3+}$, $Dy^{3+}$, $Eu^{3+}$, and $Bi^{3+}$, $M^2$ is at least one metal selected from the group consisting of $Si^{4+}$ and $Ge^{4+}$, $M^3$ is at least one metal selected from the group consisting of Al3+, B3+, and Ga3+, a is equal to or greater than about 1.8 and equal to or less than about 2.2, b is equal to or greater than about 3.8 and equal to or less than about 4.2, c is equal to or greater than about 6.7 and equal to or less than about 7.3, x is equal to or greater than about 0.7 and less than about 3, y is equal to or greater than 0 and less than about 3, and z is greater than 0 and less than about 1.

17 Claims, 7 Drawing Sheets

(56) References Cited

OTHER PUBLICATIONS

Hongchuan Zhang et al., : Preparation, Structure, and Luminescence Properties of Y2Si4N6C:Ce3+ and Y2Si4N6C: Tb3+, Journal of the Electrochemical Society, 153 (7), 2006, pp. H151-154.

Kath Liddell et al., "M2(Si,Al)4(N,C)7(M=La,Y,Ca) carbonitrides I. Synthesis and structural characterisation by XRD and NMR", Journal of the European Ceramic Society, vol. 25, 2005, pp. 37-47.

* cited by examiner

NITRIDE PHOSPHOR, METHOD OF PREPARING THE SAME, AND WHITE LIGHT-EMITTING DEVICE USING THE SAME

CROSS-REFERENCE TO RELATED APPLICATIONS

This application claims priority to Korean Patent Application No. 10-2010-0002745, filed on Jan. 12, 2010, and all the benefits accruing therefrom under 35 U.S.C. §119, the content of which in its entirety is herein incorporated by reference.

BACKGROUND

1. Field

The present disclosure relates to a nitride phosphor, a method of preparing the same, and a white light-emitting device using the same, and more particularly, to a nitride phosphor having a wide full width at half maximum ("FWHM").

2. Description of the Related Art

An optical system may include a fluorescent lamp and an incandescent lamp. Fluorescent lamps, however, cause environmental problems due to mercury (Hg) included therein. Also, such optical systems have very short lifetimes and low efficiencies and thus are unsuitable for saving energy. Therefore, much research is being performed to develop more efficient white light-emitting devices.

Such white light-emitting devices may produce white light by using at least one of the four following methods. Red, green and blue phosphors may be excited by an ultraviolet ("UV") light emitting diode ("LED") to produce white light, blue and green phosphors may be excited by a UV LED to produce white light, red and green phosphors may be excited by a blue LED to produce white light, or a yellow phosphor may be excited by a blue LED to produce white light.

A commercially available green phosphor for a UV LED has an emission peak at about 535 nanometers (nm) and a full width at half maximum ('FWHM") of about 80 nm. If the green phosphor is used with a blue phosphor having an emission peak at about 450 nm and a FWHM of about 50 nm to form a white light, a light emission valley may occur near from about 470 to about 510 nm. Accordingly, color rendering of the white light may be undesirable.

In a white light-emitting device using a UV LED as a light source, reabsorption of blue phosphor emission by a green phosphor and reabsorption of blue and green phosphor emission by a red phosphor deteriorate the overall efficiency of the white light-emitting device. Accordingly, in order to develop a phosphor for an LED, it is desirable that the phosphor have insubstantial or no reabsorption.

When a white light is provided by exciting a single white phosphor using a UV LED as a light source, color rendering of the white light may be desirable because a light emission valley near 480 nm is reduced compared to when a blue LED and a yellow phosphor are used, or when a blue LED and a green phosphor are used. In addition, reabsorption that occurs when using two or three phosphors is avoided. Also, even when the single white phosphor is used with another phosphor, the single white phosphor has a wide FWHM, and thus excellent color rendering is obtained compared to when the single white phosphor is not used.

Commercially available methods of preparing a nitride phosphor require process conditions which include a high temperature and high nitrogen gas pressure, e.g., more than 0.1 megaPascals (MPa). Thus, a special apparatus designed to withstand high temperature and high pressure is used. Moreover, unstable materials are used as starting materials, and thus, more stringent of conditions are desirably used to handle the starting materials. Accordingly, there remains a need for an improved nitride phosphor that is more easily synthesized.

SUMMARY

Provided is a nitride phosphor having a wide full width at half maximum ("FWHM").

Provided is a method of preparing the nitride phosphor, and a white light-emitting device including the nitride phosphor.

Additional aspects will be set forth in part in the description which follows and, in part, will be apparent from the description.

According to an aspect, disclosed is a nitride phosphor represented by Formula 1:

$$M^1_{a-z}Ce_zM^2_{b-x}M^3_xN_{c-y}O_y, \quad \text{Formula 1}$$

wherein $M^1$ is at least one metal selected from the group consisting of $Sc^{3+}$, $Y^{3+}$, $Lu^{3+}$, $La^{3+}$, $Pr^{3+}$, $Sm^{3+}$, $Gd^{3+}$, $Tb^{3+}$, $Yb^{3+}$, $Dy^{3+}$, $Eu^{3+}$, and $Bi^{3+}$, $M^2$ is at least one metal selected from the group consisting of $Si^{4+}$ and $Ge^{4+}$, $M^3$ is at least one metal selected from the group consisting of $Al^{3+}$, $B^{3+}$, and $Ga^{3+}$, a is equal to or greater than about 1.8 and equal to or less than about 2.2, b is equal to or greater than about 3.8 and equal to or less than about 4.2, c is equal to or greater than about 6.7 and equal to or less than about 7.3, x is equal to or greater than about 0.7 and less than about 3, y is equal to or greater than 0 and less than about 3, and z is greater than 0 and less than about 1.

The nitride phosphor may be represented by Formula 2:

$$M^1_{2-z}Ce_zSi_3AlN_{c-y}O_y, \quad \text{Formula 2}$$

wherein $M^1$ is at least one metal selected from the group consisting of $Sc^{3+}$, $Y^{3+}$, $Lu^{3+}$, $La^{3+}$, $Pr^{3+}$, $Sm^{3+}$, $Gd^{3+}$, $Tb^{3+}$, $Yb^{3+}$, $Dy^{3+}$, $Eu^{3+}$, and $Bi^{3+}$, c is equal to or greater than about 6.7 and equal to or less than about 7.3, y is equal to or greater than 0 and less than about 3, and z is greater than 0 and less than about 1.

According to another aspect, a white light-emitting device includes: a light-emitting diode ("LED"); and the nitride phosphor.

According to another aspect, disclosed is a method of preparing the nitride phosphor. The method includes: combining an $M^1$ precursor compound, a Ce precursor compound, an $M^2$ precursor compound, an $M^3$ precursor compound, and a carbon-based material to prepare a mixture; calcining the mixture to provide a calcined mixture; and pulverizing the calcined mixture to provide the nitride phosphor.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
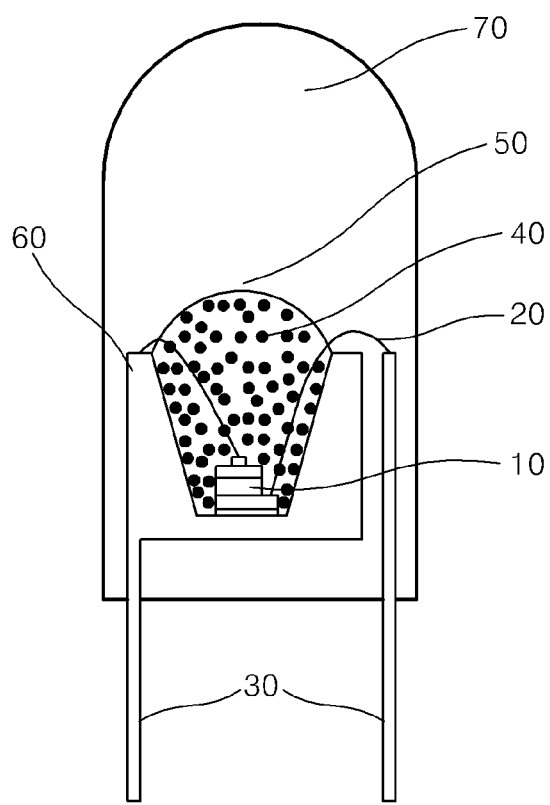
FIG. 1 is a schematic view illustrating a structure of an exemplary embodiment of a white light-emitting device.

Reference will now be made in further detail to representative embodiments, examples of which are illustrated in the accompanying drawings. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers, and/or sections, these elements, components, regions, layers and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

A nitride phosphor according to an embodiment may be represented by Formula 1 below:

$$M^1_{a-z}Ce_zM^2_{b-x}M^3_xN_{c-y}O_y \qquad \text{Formula 1}$$

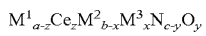

In Formula 1, $M^1$ is at least one metal selected from the group consisting of $Sc^{3+}$, $Y^{3+}$, $Lu^{3+}$, $La^{3+}$, $Pr^{3+}$, $Sm^{3+}$, $Gd^{3+}$, $Tb^{3+}$, $Yb^{3+}$, $Dy^{3+}$, $Eu^{3+}$, and $Bi^{3+}$, $M^2$ is at least one metal selected from the group consisting of $Si^{4+}$ and $Ge^{4+}$, $M^3$ is at least one metal selected from the group consisting of $Al^{3+}$, $B^{3+}$, and $Ga^{3+}$, a is equal to or greater than about 1.8 and equal to or less than about 2.2, b is equal to or greater than about 3.8 and equal to or less than about 4.2, c is equal to or greater than about 6.7 and equal to or less than about 7.3, x is equal to or greater than about 0.7 and less than about 3, and z is greater than 0 and less than about 1. In an embodiment, a is equal to or greater than about 1.9 and equal to or less than about 2.1, b is equal to or greater than about 3.9 and equal to or less than about 4.1, c is equal to or greater than about 6.8 and equal to or less than about 7.2, x is equal to or greater than about 1 and less than about 2, and z is greater than 0 and less than about 0.5.

The nitride phosphor has an emission peak at about 430 to about 550 nanometers (nm), specifically at about 450 to about 540 nm, more specifically at about 470 to about 530 nm, and a wide full width at half maximum ("FWHM") of about 100 to about 150 nm, specifically about 105 to about 140 nm, more specifically about 110 to about 130 nm. Accordingly, a valley between a blue emission and a green emission of a commercially available phosphor may be substantially filled. Also, absorption at a wavelength of about 400 nm is excellent and absorption at other wavelengths is remarkably low, and thus when the nitride phosphor is used in an ultraviolet ("UV") light-emitting diode ("LED"), deterioration of a light-emitting efficiency caused by reabsorption of a blue light of a blue phosphor may be substantially prevented or effectively eliminated.

$Ce^{3+}$ of the nitride phosphor may be doped in a site of $M^1$ of Formula 1. In an embodiment, an excited state of $Ce^{3+}$ is about 3.1 eV higher with respect to a ground state due to a crystal field determined by nitrogen and oxygen ions around the site of $M^1$. Accordingly, the nitride phosphor is suitable for the UV LED. Also, in the nitride phosphor, $M^2$ and $M^3$ are crystallographically in the same site, but the corresponding site is occupied by a mixture of 4+ and 3+ positive ions. Accordingly, an electron structure of $Ce^{3+}$, which is affected by a crystal structure of a doped host, also has various energies. Consequently, light emitted by $Ce^{3+}$ also has a wide FWHM. The nitride phosphor may be represented by Formula 2 below:

$$M^1{}_{2-z}Ce_zSi_3AlN_{c-y}O_y \qquad \text{Formula 2}$$

In Formula 2, $M^1$ is at least one metal selected from the group consisting of $Sc^{3+}$, $Y^{3+}$, $Lu^{3+}$, $La^{3+}$, $Pr^{3+}$, $Sm^{3+}$, $Gd^{3+}$, $Tb^{3+}$, $Yb^{3+}$, $Dy^{3+}$, $Eu^{3+}$, and $Bi^{3+}$, c is equal to or greater than about 6.7 and equal to or less than about 7.3, y is equal to or greater than 0 and less than about 3, and z is greater than 0 and less than about 1.

In an embodiment, the nitride phosphor may be at least one selected from the group consisting of $La_{0.6}Y_{1.4}Si_3AlN_7$:$0.02Ce^{3+}$, $La_{0.8}Y_{1.2}Si_3AlN_7$:$0.02Ce^{3+}$, $LaYSi_3AlN_7$:$0.02Ce^{3+}$, $La_2Si_3AlN_7$:$0.02Ce^{3+}$, $(Y,La)_2Si_2Al_2ON_6$:$Ce^{3+}$, and $(Y,La)_2SiAl_3O_2N_5$:$Ce^{3+}$.

A white light-emitting device according to an embodiment includes an LED and the nitride phosphor of Formula 1. The white light-emitting device may have a color rendering index ("CRI") of equal to or greater than about 80, specifically equal to or greater than about 85, more specifically equal to or greater than about 90.

Because the nitride phosphor has a wide emission band and an emission peak around a blue and green wavelength, a bluish green color that was not provided by a commercially available phosphor may be provided. Accordingly, the nitride phosphor may be used to prepare a white light-emitting device having an excellent CRI. Also, because a light having a wavelength of about 400 nm, which corresponds to the UV LED, is intensively absorbed, even when the nitride phosphor is mixed with a phosphor of another color while preparing the white light-emitting device, a red or blue phosphor reabsorption phenomenon does not substantially occur. Accordingly, deterioration in light-emitting efficiency due to reabsorption may be substantially prevented or effectively eliminated.

Accordingly, the white light-emitting device may be used for general lighting as well as special lighting, such as for illumination in a medical institution, a food display, a museum, or an art gallery, and may be used for a backlight unit of a small display device, such as a mobile device or a laptop. In addition, the white light-emitting device may also be used as a headlamp of a car or a light source of communication equipment.

The UV LED may be an excitation source emitting UV or near-UV electromagnetic radiation. In the white light-emitting device, a wavelength band of the excitation source of the UV LED may be about 340 to about 430 nm, specifically about 350 to about 420 nm, more specifically about 360 to about 410 nm.

The white light-emitting device may further include at least one of a blue phosphor, a green phosphor, and a red phosphor. For example, the white light-emitting device may further include both a blue phosphor and a green phosphor.

The blue phosphor may be at least one selected from the group consisting of $(Sr,Ba,Ca)_5(PO_4)_3Cl$:$Eu^{2+}$; $BaMg_2Al_{16}O_{27}$:$Eu^{2+}$; $Sr_4Al_{14}O_{25}$:$Eu^{2+}$; $BaAl_8O_{13}$:$Eu^{2+}$; $(Sr,Mg,Ca,Ba)_5(PO_4)_3Cl$:$Eu^{2+}$; $BaMgAl_{10}O_{17}$:$Eu^{2+}$; and $Sr_2Si_3O_8$·$2SrCl_2$:$Eu^{2+}$.

The green phosphor may be at least one selected from the group consisting of $(Ba,Sr,Ca)_2SiO_4$:$Eu^{2+}$; $Ba_2MgSi_2O_7$:$Eu^{2+}$; $Ba_2ZnSi_2O_7$:$Eu^{2+}$; $BaAl_2O_4$:$Eu^{2+}$; $SrAl_2O_4$:$Eu^{2+}$; $BaMgAl_{10}O_{17}$:$Eu^{2+}$, $Mn^{2+}$; and $BaMg_2Al_{16}O_{27}$:$Eu^{2+}$, $Mn^{2+}$.

The red phosphor may be at least one selected from the group consisting of $(Sr,Ca)S$:$Eu^{2+}$; $(Sr,Ca)AlSiN_3$:$Eu^{2+}$; $Sr_2Si_5N_8$:$Eu^{2+}$; $(Sr,Ba,Ca)_2P_2O_7$:$Eu^{2+}$, $Mn^{2+}$; $(Ba,Mg)SiO_4$:$Eu^{2+}$, $Mn^{2+}$; $(Ba,Ca)Ga_2O_7$:$Eu^{2+}$, $Mn^{2+}$; $Ba_2MgSi_2O_7$:$Eu^{2+}$, $Mn^{2+}$; and $3.5MgO$·$0.5MgF_2$·$GeO_4$:$Mn^{4+}$.

A peak wavelength of an emission spectrum of the blue phosphor may be about 400 to about 460 nm, specifically about 410 to about 450 nm, more specifically about 420 to about 440 nm.

A peak wavelength of an emission spectrum of a green phosphor may be about 500 to about 560 nm, specifically about 510 to about 540 nm, more specifically about 515 to about 530 nm.

A peak wavelength of an emission spectrum of a red phosphor may be about 600 to about 670 nm, specifically about 605 to about 650 nm, more specifically about 610 to about 630 nm.

FIG. 1 is a schematic view of a structure of an exemplary embodiment of a white light-emitting device. The white light-emitting device illustrated in FIG. 1 is a polymer lens type, surface-mounted white light-emitting device. An exemplary polymer lens is an epoxy lens.

Referring to FIG. 1, a UV emitting LED chip 10 is die-bonded to an electric lead line 30 via a gold wire 20, and an epoxy mold layer 50 is formed on the UV emitting LED chip 10 to include a phosphor composition 40 containing the nitride phosphor of Formula 1. A reflective film coated with aluminum or silver is formed on an inner surface of a mold 60 to reflect light upward from the UV emitting LED chip 10 and to limit the epoxy of the epoxy mold layers 50 to an appropriate amount.

An epoxy dome lens 70 is formed above the epoxy mold layer 50. The shape of the epoxy dome lens 70 may vary according to a desired orientation angle.

The LED used in the white light-emitting device is not limited to the structure illustrated in FIG. 1. Other structures, e.g., a phosphor-mounted LED, a shell-type LED, and a printed circuit board ("PCB")-type surface-mounted LED may also be used.

In another embodiment, the nitride phosphor of Formula 1 may be applied to a lamp such as a mercury lamp or a xenon lamp, or a self-emission liquid crystal display ("LCD"), in addition to the white light-emitting device as described above.

A method of preparing the nitride phosphor of Formula 1 includes: combining a $M^1$ precursor compound, a $M^2$ precursor compound, a Ce precursor compound, a $M^3$ precursor compound, and a carbon-based material to provide a mixture; calcining the mixture to provide a calcined mixture; and pulverizing the calcined mixture to provide the nitride phosphor.

The $M^1$ precursor compound may be a compound comprising at least one metal selected from the group consisting of $Sc^{3+}$, $Y^{3+}$, $Lu^{3+}$, $La^{3+}$, $Pr^{3+}$, $Sm^{3+}$, $Gd^{3+}$, $Tb^{3+}$, $Yb^{3+}$, $Dy^{3+}$, $Eu^{3+}$, and $Bi^{3+}$, and the $M^2$ precursor compound may be a compound comprising at least one metal selected from the group consisting of $Si^{4+}$ and $Ge^{4+}$. For example, a La precursor compound may include at least one selected from the group consisting of La, $La_2O_3$, LaN, $La_2(CO_3)_3$, $La(NO_3)_3$, $La(OH)_3$, $LaCl_3$, and $La(CH_2COOH)_3$. A Y precursor compound may include at least one selected from the group consisting of Y, $Y_2O_3$, YN, $Y_2(CO_3)_3$, $Y(NO_3)_3$, $Y(OH)_3$, $YCl_3$, and $Y(CH_2COOH)_3$. A Si precursor compound may include at least one selected from the group consisting of Si, $SiO_2$, $Si_3N_4$, and $Si(NH)_2$. A Ce precursor compound may include at least one selected from the group consisting of Ce, $CeO_2$, $Ce_2(CO_3)_3$, $(NH_4)_2Ce(NO_3)_6$, and $CeCl_4$. Also, an Al precursor compound may include at least one selected from the group consisting of Al, AlN, $Al_2O_3$, and $Al(OH)_3$.

Examples of the carbon-based material include at least one selected from the group consisting of carbon black, graphite, active carbon, carbon paper, carbon-based polymer, graphene, and carbon nanotube ("CNT").

Optionally, a precursor compound comprising at least one metal selected from the group consisting of $Mg^{2+}$, $Ca^{2+}$, $Sr^{2+}$, $Ba^{2+}$, $Eu^{2+}$, and $Zn^{2+}$ may be further added while combining the above disclosed precursor compounds and carbon-based material. The precursor compound may include at least one selected from the group consisting of Eu, $Eu_2O_3$, EuN, $Eu_2(CO_3)_3$, $Eu(NO_3)_3$, $Eu(OH)_3$, $EuCl_3$, and $Eu(CH_2COOH)_3$.

When $Si_3N_4$ and AlN are used as a precursor compound of Si and Al, $Si_3N_4$ and AlN may be stabilized in the air, and calcined in a commercially available high-temperature furnace at about 1600 to about 1700° C., specifically at about 1625 to 1675° C., more specifically at about 1650° C.

A representative method of synthesizing the nitride phosphor will now be disclosed in further detail.

First, the $M^1$ precursor compound, the $M^2$ precursor compound, the $M^3$ precursor compound, the Ce precursor compound, and the carbon-based material are combined to provide a mixture. Then, the mixture is calcined at a temperature of about 1600 to about 1700° C., specifically at about 1625 to 1675° C., more specifically at about 1650° C., for about 1 hour to about 20 hours, specifically about 2 hours to about 18 hours, more specifically about 4 hours to about 16 hours, under a nitrogen/hydrogen reducing atmosphere comprising about 95% nitrogen and about 5% hydrogen, by volume, to provide a calcined mixture. Next, the calcined mixture is pulverized to provide the nitride phosphor.

The amount of the $M^1$ precursor compound, the $M^2$ precursor compound, the $M^3$ precursor compound, and the Ce precursor compound may be selected so that each respective element satisfies Formula 1. Also, the amount of the carbon-based material may be about 20 to about 200 percent (%), specifically about 40 to about 1500%, more specifically about 60 to about 100%, based on the total mass of a phosphor raw material.

Hereinafter, a representative embodiment will be disclosed in further detail with reference to the following examples. However, these examples shall not limit the purpose or scope of the disclosed embodiments.

Example 1

Preparation of $La_{0.6}Y_{1.4}Si_3AlN_7:0.02Ce^{3+}$ Phosphor

A nitride phosphor was prepared using a solid phase reaction method. Raw material powder shown in Table 1 below was mixed for 10 minutes using a mortar. The mixed powder was put into an alumina reaction container, and calcined at 1650° C. for 6 hours under a reducing atmosphere of 95% $N_2$ and 5% $H_2$ by volume. Then, a phosphor obtained after the reaction was pulverized for 10 minutes using the mortar.

Example 2

Preparation of $La_{0.8}Y_{1.2}Si_3AlN_7:0.02Ce^{3+}$ Phosphor

A phosphor was obtained in the same manner as in Example 1, except that raw material powder shown in Table 1 was used.

Example 3

Preparation of $LaYSi_3AlN_7:0.02Ce^{3+}$ Phosphor

A phosphor was obtained in the same manner as in Example 1, except that raw material powder shown in Table 1 was used.

Example 4

Preparation of $La_2Si_3AlN_7:0.02Ce^{3+}$ Phosphor

A phosphor was obtained in the same manner as in Example 1, except that raw material powder shown in Table 1 was used.

Comparative Example 1

Preparation of $Y_2Si_4N_6C:0.02Ce^{3+}$ Phosphor

A phosphor was obtained in the same manner as in Example 1, except that raw material powder shown in Table 1 was used.

TABLE 1

| | $La_2O_3$ (g) | $Y_2O_3$ (g) | $Si_3N_4$ (g) | AlN (g) | $CeO_2$ (g) | Carbon (g) |
|---|---|---|---|---|---|---|
| Example 1 | 1.13 | 0.70 | 1.00 | 0.29 | 0.05 | 3.00 |
| Example 2 | 0.97 | 0.93 | 1.00 | 0.29 | 0.05 | 3.00 |
| Example 3 | 0.81 | 1.16 | 1.00 | 0.29 | 0.05 | 3.00 |
| Example 4 | 2.32 | 0.00 | 1.00 | 0.29 | 0.05 | 3.00 |
| Comparative Example 1 | 0.00 | 3.00 | 2.48 | 0.00 | 0.09 | 7.00 |

In Table 1, g refers to grams.

Figure 2:
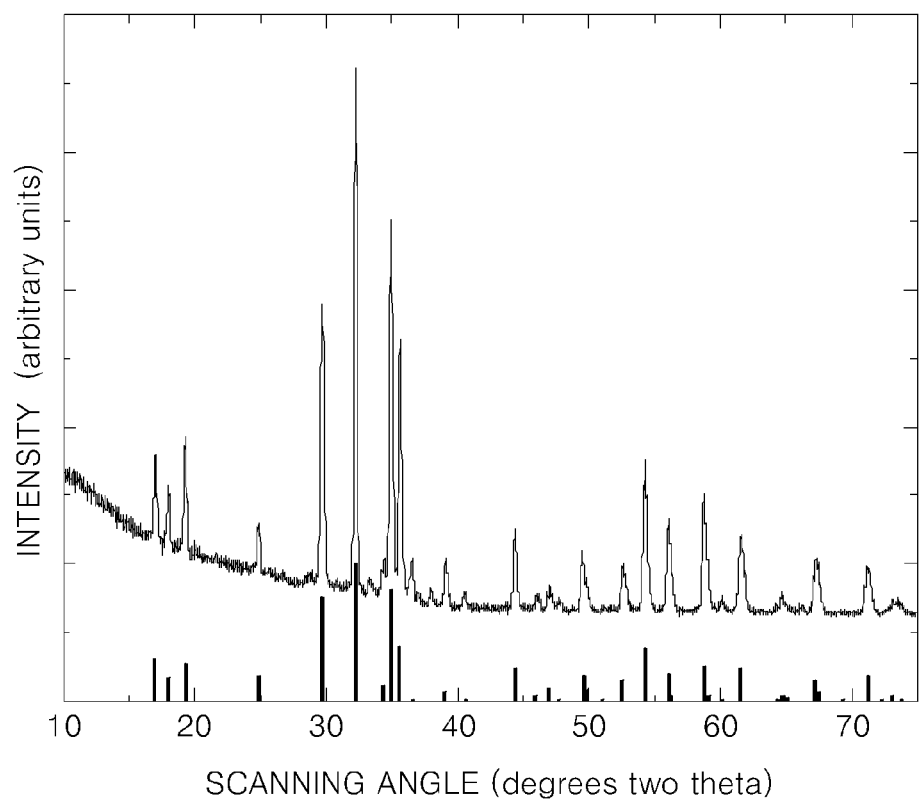
FIG. 2 is a graph of intensity (arbitrary units) versus scattering angle (degrees two theta) illustrating an X-ray diffraction ("XRD") spectrum of a phosphor prepared according to Example 3.

FIG. 2 is a graphical view of an X-ray diffraction (XRD) spectrum of a phosphor prepared according to Example 3. Also included in FIG. 2 is a calculated idealized XRD pattern for $BaYbSi_4N_7$ as a reference. As shown in FIG. 2, the nitride phosphor has a hexagonal structure (e.g., the hexagonal space group $P6_3mc$) like $BaYbSi_4N_7$, and although it is not shown, $Y_2Si_4N_6C$ of Comparative Example 1 has a similar crystal structure.

Figure 3:
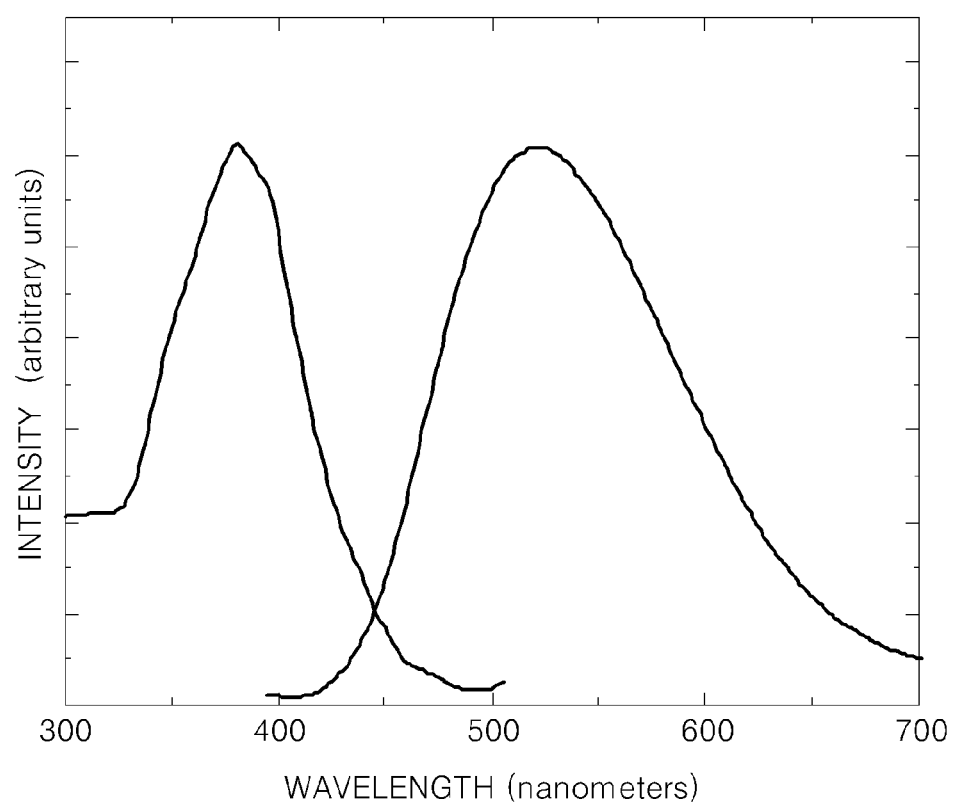
FIG. 3 is a graph of intensity (arbitrary units) versus wavelength (nanometers) illustrating an excitation and emission spectrum of a phosphor prepared according to Example 1.
Figure 4:
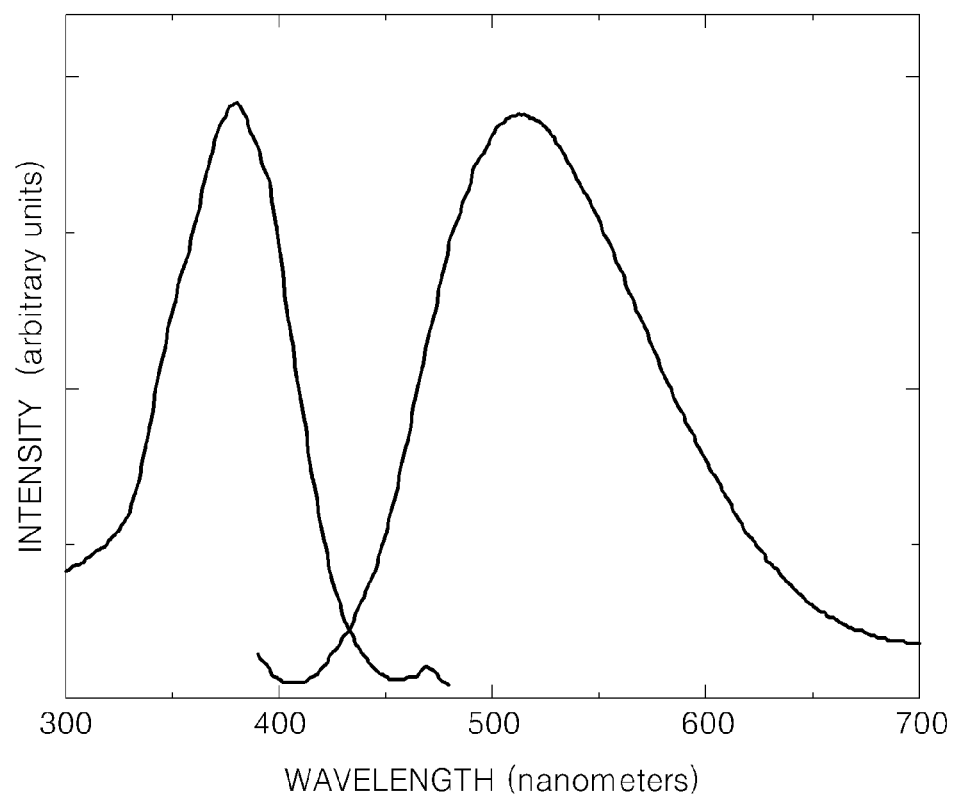
FIG. 4 is a graph of intensity (arbitrary units) versus wavelength (nanometers) illustrating an excitation and emission spectrum of a phosphor prepared according to Example 2.
Figure 5:
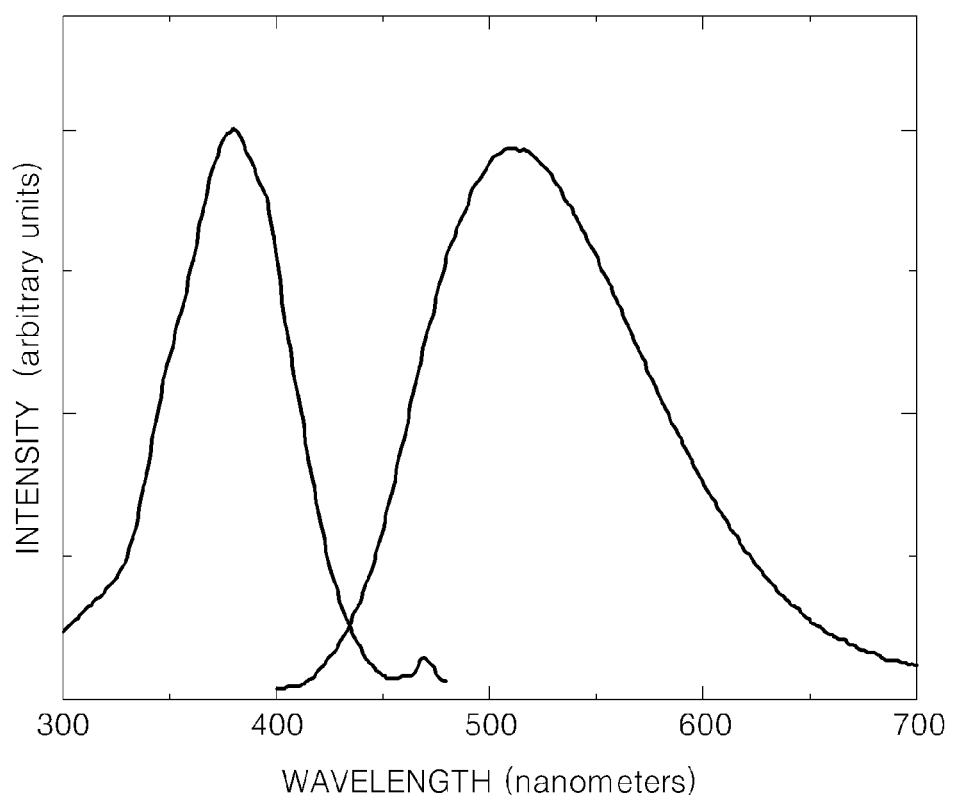
FIG. 5 is a graph of intensity (arbitrary units) versus wavelength (nanometers) illustrating an excitation and emission spectrum of a phosphor prepared according to Example 3.

FIGS. 3 through 5 are graphical views of excitation and emission spectra of the phosphors respectively prepared according to Examples 1 through 3. As shown in FIGS. 3 through 5, the phosphors are especially suitable for an UV LED, because the phosphors show strong absorption near about 400 nm, for example at about 350 to about 400 nm. Here, peaks of the excitation and emission spectra show that short wavelength light is emitted when a ratio of La with respect to Y is high.

Figure 6:
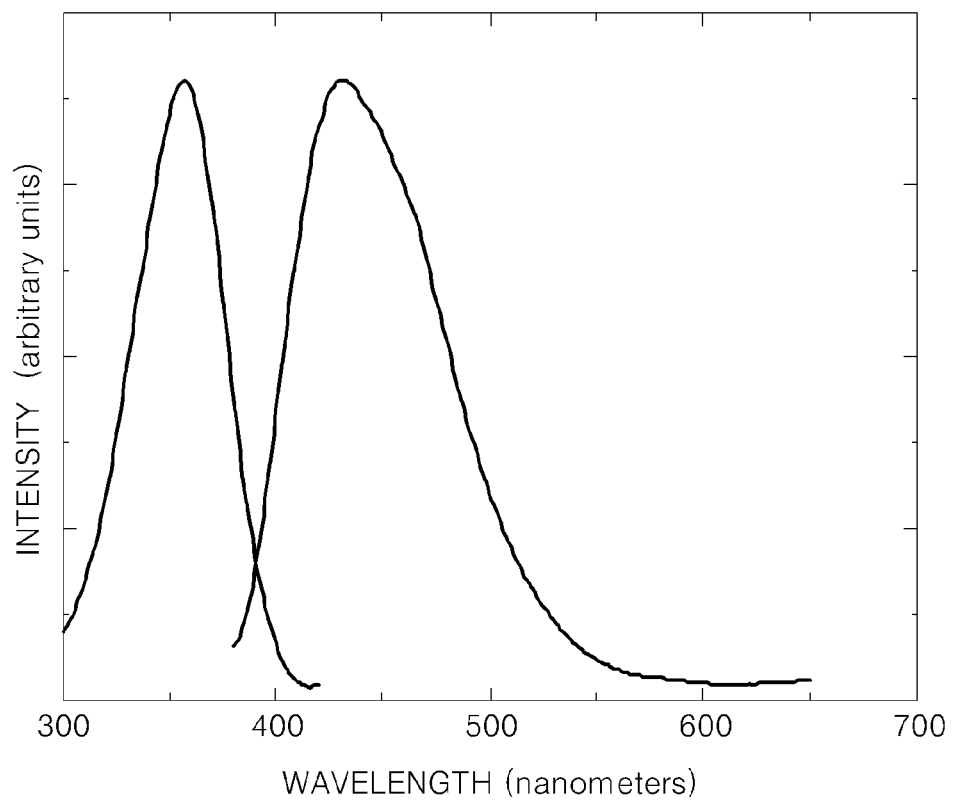
FIG. 6 is a graph of intensity (arbitrary units) versus wavelength (nanometers) illustrating an excitation and emission spectrum of a phosphor prepared according to Example 4.

FIG. 6 is a graphical view of an excitation and emission spectrum of the phosphor prepared according to Example 4. The phosphor of Example 4 is prepared by forming $M^1$ of Formula 1 with only La and without Y. The phosphor emits light of an extremely short wavelength, i.e., 430 nm, and absorbs light having a wavelength of 355 nm.

Figure 7:
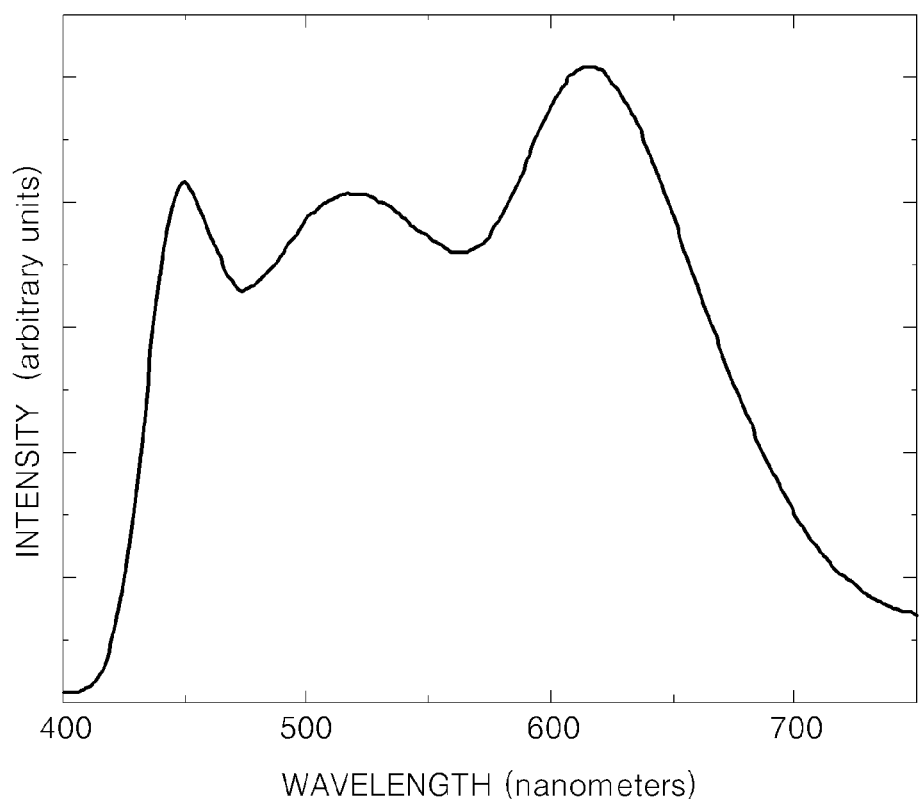
FIG. 7 is a graph of intensity (arbitrary units) versus wavelength (nanometers) illustrating an emission spectrum of a white light-emitting device including the phosphor of Example 1.

FIG. 7 is a graphical view of an emission spectrum of a white light-emitting device including the phosphor of Example 1 prepared by mixing a blue phosphor, i.e., $Sr_5(PO_4)_3Cl:Eu^{2+}$, and a red phosphor, i.e., $Sr_2Si_5N_8:Eu^{2+}$. White light of the white light-emitting device has a color coordination of 0.3689, 0.3620 and color temperature of about 4200 Kelvin (K). Also, as shown in FIG. 7, the white light-emitting device shows a high Color Rendering Index ("CRI") of about 93 and widely covers the visible wavelength region.

As further disclosed above, according to the one or more of the above embodiments, when the nitride phosphor is used for a white light-emitting device, the white light-emitting device shows excellent color rendering and a reabsorption phenomenon is substantially prevented or effectively eliminated.

The embodiments described herein shall be considered in a descriptive sense only and not for purposes of limitation. Descriptions of features, advantages, or aspects of each embodiment should be considered as available for other similar features, advantages, or aspects in other embodiments.

What is claimed is:

1. A nitride phosphor represented by Formula 1:

$$M^1_{a-z}Ce_zM^2_{b-x}M^3_xN_{c-y}O_y,\quad\text{Formula 1}$$

wherein
M$^1$ is at least one metal selected from the group consisting of Sc$^{3+}$, Y$^{3+}$, Lu$^{3+}$, La$^{3+}$, Pr$^{3+}$, Sm$^{3+}$, Gd$^{3+}$, Tb$^{3+}$, Yb$^{3+}$, Dy", and Eu$^{3+}$,
M$^2$ is at least one metal selected from the group consisting of Si$^{4+}$ and Ge$^{4+}$,
M$^3$ is at least one metal selected from the group consisting of Al$^{3+}$, B$^{3+}$, and Ga$^{3+}$,
a is equal to or greater than about 1.8 and equal to or less than about 2.2,
b is equal to or greater than about 3.8 and equal to or less than about 4.2,
c is equal to or greater than about 6.7 and equal to or less than about 7.3,
x is equal to or greater than about 0.7 and less than about 3,
y is equal to or greater than 0 and less than about 3, and
z is greater than 0 and less than about 1.

2. The nitride phosphor of claim 1, represented by $$M^1_{2-z}Ce_zSi_3AlN_{c-y}O_y,\quad\text{Formula 2}$$

wherein
M$^1$ is at least one metal selected from the group consisting of Sc$^{3+}$, Y$^{3+}$, Lu$^{3+}$, La$^{3+}$, Pr$^{3+}$, Sm$^{3+}$, Gd$^{3+}$, Tb$^{3+}$, Yb$^{3+}$, Dy$^{3+}$, and Eu$^{3+}$,
c is equal to or greater than about 6.7 and equal to or less than about 7.3,
y is equal to or greater than 0 and less than about 3, and
z is greater than 0 and less than about 1.

3. The nitride phosphor of claim 1, comprising at least one selected from the group consisting of La$_{0.6}$Y$_{1.4}$Si$_3$AlN$_7$:0.02Ce$^{3+}$, La$_{0.8}$Y$_{1.2}$Si$_3$AlN$_7$:0.02Ce$^{3+}$, LaYSi$_3$AlN$_7$:0.02Ce$^{3+}$, La$_2$Si$_3$AlN$_7$:0.02Ce$^{3+}$, (Y,La)$_2$Si$_2$Al$_2$ON$_6$:Ce$^{3+}$, and (Y,La)$_2$SiAl$_3$O$_2$N$_5$:Ce$^{3+}$.

4. The nitride phosphor of claim 1, wherein a full width at half maximum of an emission spectrum is about 100 to about 120 nanometers.

5. The nitride phosphor of claim 1, wherein an emission wavelength is about 430 to about 550 nm.

6. A method of preparing the nitride phosphor of claim 1, the method comprising:
combining an M$^1$ precursor compound, a Ce precursor compound, an M$^2$ precursor compound, an M$^3$ precursor compound, and a carbon-based material to provide a mixture;
calcining the mixture to provide a calcined mixture; and
pulverizing the calcined mixture to provide the nitride phosphor.

7. The method of claim 6, wherein the calcining is performed at a temperature of about 1600 to about 1700° C.

8. A white light-emitting device comprising:
a light-emitting diode; and
the nitride phosphor of claim 1.

9. The white light-emitting device of claim 8, wherein a color rendering index is equal to or greater than about 80.

10. The white light-emitting device of claim 8, wherein the light-emitting diode is an ultraviolet light-emitting device.

11. The white light-emitting device of claim 10, wherein a peak wavelength of an excitation light of the light-emitting device is about 340 to about 430 nanometers.

12. The white light-emitting device of claim 10, further comprising at least one phosphor selected from the group consisting of a red phosphor, a blue phosphor, and a green phosphor.

13. The white light-emitting device of claim 12, wherein the blue phosphor comprises at least one selected from the group consisting of (Sr,Ba,Ca)$_5$(PO$_4$)$_3$Cl:Eu$^{2+}$; BaMg$_2$Al$_{16}$O$_{27}$:Eu$^{2+}$; Sr$_4$Al$_{14}$O$_{25}$:Eu$^{2+}$; BaAl$_8$O$_{13}$:Eu$^{2+}$; (Sr,Mg,Ca,Ba)$_5$(PO$_4$)$_3$Cl:Eu$^{2+}$; BaMgAl$_{10}$O$_{17}$:Eu$^{2+}$; and Sr$_2$Si$_3$O$_8$2SrCl$_2$:Eu$^{2+}$.

14. The white light-emitting device of claim 12, wherein the green phosphor comprises at least one selected from the group consisting of (Ba,Sr,Ca)$_2$SiO$_4$:Eu$^{2+}$; Ba$_2$MgSi$_2$O$_7$:Eu$^{2+}$; Ba$_2$ZnSi$_2$O$_7$:Eu$^{2+}$; BaAl$_2$O$_4$:Eu$^{2+}$; SrAl$_2$O$_4$:Eu$^{2+}$; BaMgAl$_{10}$O$_{17}$:Eu$^{2+}$, Mn$^{2+}$; and BaMg$_2$Al$_{16}$O$_{27}$:Eu$^{2+}$, Mn$^{2+}$.

15. The white light-emitting device of claim 12, wherein the red phosphor comprises at least one selected from the group consisting of (Sr,Ca)S:Eu$^{2+}$; (Sr,Ca)AlSiN$_3$:Eu$^{2+}$; Sr$_2$Si$_5$N$_8$:Eu$^{2+}$; (Sr,Ba,Ca)$_2$P$_2$O$_7$:Eu$^{2+}$, Mn$^{2+}$; (Ba,Mg)SiO$_4$:Eu$^{2+}$, Mn$^{2+}$; (Ba,Ca)Ga$_2$O$_7$:Eu$^{2+}$, Mn$^{2+}$; Ba$_2$MgSi$_2$O$_7$:Eu$^{2+}$, Mn$^{2+}$; and 3.5MgO.0.5MgF$_2$.GeO$_4$:Mn$^{4+}$.

16. The white light-emitting device of claim 8, wherein a peak wavelength of an emission spectrum of the nitride phosphor is about 430 to about 550 nanometers.

17. The white light-emitting device of claim 8, wherein the white light-emitting device is used for a traffic light, communication equipment, a backlight of a display apparatus, or a lighting device.

* * * * *